(12) United States Patent
Chiba et al.

(10) Patent No.: US 7,286,346 B2
(45) Date of Patent: Oct. 23, 2007

(54) PERIPHERAL DEVICE AND ELECTRONIC DEVICE

(75) Inventors: Osamu Chiba, Tokyo (JP); Shohei Moriwaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/442,283

(22) Filed: May 30, 2006

(65) Prior Publication Data

US 2007/0064397 A1 Mar. 22, 2007

(30) Foreign Application Priority Data

Sep. 22, 2005 (JP) ............................. 2005-276348

(51) Int. Cl.
*H05K 7/20* (2006.01)
*F28D 15/00* (2006.01)

(52) U.S. Cl. ..................... 361/687; 361/699; 361/700; 165/80.4; 165/104.33; 165/272

(58) Field of Classification Search ........ 361/699–702, 361/687; 165/80.4–80.5, 104.33, 272
See application file for complete search history.

(56) References Cited

U.S. PATENT DOCUMENTS

| 4,067,237 | A | * | 1/1978 | Arcella | ..................... | 73/204.23 |
| 4,106,554 | A | * | 8/1978 | Arcella | ....................... | 165/272 |
| 4,177,858 | A | * | 12/1979 | Daman et al. | ............. | 165/11.1 |
| 5,647,429 | A | * | 7/1997 | Oktay et al. | ........... | 165/104.26 |
| 5,898,569 | A | * | 4/1999 | Bhatia | ......................... | 361/700 |
| 5,946,191 | A | * | 8/1999 | Oyamada | ..................... | 361/700 |
| 6,084,769 | A | * | 7/2000 | Moore et al. | ................ | 361/687 |
| 6,111,751 | A | * | 8/2000 | Sakuyama | ................... | 361/704 |
| 6,118,654 | A | * | 9/2000 | Bhatia | ......................... | 361/687 |
| 6,181,553 | B1 | * | 1/2001 | Cipolla et al. | .............. | 361/687 |
| 6,288,896 | B1 | * | 9/2001 | Hsu | ........................... | 361/687 |
| 6,445,580 | B1 | * | 9/2002 | Cohen et al. | ............... | 361/687 |
| 6,535,386 | B2 | * | 3/2003 | Sathe et al. | ................. | 361/700 |
| 6,601,179 | B1 | * | 7/2003 | Jackson et al. | ............. | 713/322 |
| 6,657,859 | B1 | * | 12/2003 | Karr | ........................... | 361/687 |

(Continued)

FOREIGN PATENT DOCUMENTS

JP 63-302584 12/1988

OTHER PUBLICATIONS

SFF Committee, "INF-8074i Specification for Small Formfactor Pluggable Transceiver", Rev. 1.0, 2001, pp. 1-38.

(Continued)

*Primary Examiner*—Jayprakash Gandhi
*Assistant Examiner*—Robert J. Hoffberg
(74) *Attorney, Agent, or Firm*—Leydig, Voit & Mayer, Ltd.

(57) ABSTRACT

A peripheral device is detachably connected to a host device and includes: an electronic component that generates heat; an electrical connector for electrically connecting the electronic component to the host device; a heat transfer device having a first end thermally connected to the electronic component; and a heat transfer connector thermally connecting a second of the heat transfer device to the host device. The heat generated by the electronic component is discharged, or transferred, to the host device side through the heat transfer device and the heat transfer connector.

8 Claims, 5 Drawing Sheets

U.S. PATENT DOCUMENTS

| | | | | |
|---|---|---|---|---|
| 6,674,643 | B2* | 1/2004 | Centola et al. | 361/720 |
| 7,227,749 | B2* | 6/2007 | Rockenfeller | 361/688 |
| 2003/0183381 | A1* | 10/2003 | Garner et al. | 165/274 |
| 2006/0120036 | A1* | 6/2006 | Rockenfeller | 361/688 |

OTHER PUBLICATIONS

XENPAX, 10 Gigabit Ethernet MSA, "A Cooperation Agreement for 10 Gigabit Ethernet Transceiver Package", Issue 3.0, Draft 3.0, Sep. 2002, pp. 1-79.

Patent Licensing Promotion Chart 2001, Mechanical Device 4: Heat Pipe, 2001. http://www.ryutu.ncipi.go.jp/chart/H13/kikai04/1/pdf/1-1.pdf.

A document distributed at a homecoming held by the Faculty of Engineering, Kumamoto University, "Transferring Heat at Hight Speed (Operating Mechanism of Heat Pipe)", Nov. 2, 2002, http://www.eng.kumamoto-e.ac.jp/events/tanken2002/image/mech-heatpipe.PDF.

* cited by examiner

PERIPHERAL DEVICE AND ELECTRONIC DEVICE

BACKGROUND OF THE INVENTION

1. Field of the Invention

The present invention relates to a miniaturized peripheral device detachably connected to the host device and adapted to allow its electronic components to be efficiently cooled. The present invention also relates to an electronic device including a host device and such a peripheral device.

2. Background Art

FIG. 5 is a perspective view of a typical conventional optical transceiver. This conventional optical transceiver has only two interfaces: an electrical connector 31 for exchanging electrical signals with the host device side; and an optical fiber 32 for exchanging optical signals with the line side.

The optical transceiver also includes intense-heat generating components, such as a laser emitting device and a photoreceptor device, and semiconductor devices for data communications, such as a PHY-LSI and a CDR. The amount of heat generated by these semiconductor devices has also increased as their power consumption has increased as a result of enhancing their switching speed to accommodate an increase in the communication speed in recent years. Therefore, the temperature of the optical transceiver must be reduced by external air cooling to ensure stable operation of the device.

To efficiently perform air cooling, it is necessary to tightly join the cooling body and the electronic components to be cooled together and, furthermore, increase the surface area of the cooling body. Therefore, a conventional optical transceiver is constructed such that: air-cooling fins 34 (a cooling body) are provided on the outside surface of an enclosure 33; and the enclosure 33 has protrusions on its inside that are in contact with the electronic components. With this arrangement, a blower mechanism is provided in the host device to efficiently air-cool the enclosure 33 of the optical transceiver.

On the other hand, electronic devices have been proposed which employ a heat pipe to cool its heat generating electronic components (see, e.g., Japanese Patent Laid-Open No. 63-302584).

However, conventional electronic devices using air-cooling fins and a blower mechanism are high in manufacturing cost and are difficult to miniaturize. Further, in the case of conventional electronic devices using a heat pipe, the optical transceiver is integrated with the host device; that is, the optical transceiver is not detachable from the host device.

SUMMARY OF THE INVENTION

The present invention has been devised to solve the above problems. It is, therefore, an object of the present invention to provide a miniaturized peripheral device detachably connected to the host device and adapted to allow its electronic components to be efficiently cooled. Another object of the present invention is to provide an electronic device including a host device and such a peripheral device.

According to one aspect of the present invention, a peripheral device is detachably connected to a host device and includes: an electronic component that generates heat; an electrical connector for electrically connecting the electronic component to the host device; heat transfer means having one end thermally connected to the electronic component; and a heat transfer connector for thermally connecting the other end of the heat transfer means to the host device; wherein the heat generated by the electronic component is discharged, or transferred, to the host device side through the heat transfer means and the heat transfer connector.

The present invention provides a miniaturized peripheral device detachably connected to the host device and adapted to allow its electronic components to be efficiently cooled. The present invention also provides an electronic device including a host device and such a peripheral device.

Other and further objects, features and advantages of the invention will appear more fully from the following description.

DETAILED DESCRIPTION OF THE PREFERRED EMBODIMENTS

First Embodiment

Figure 1:
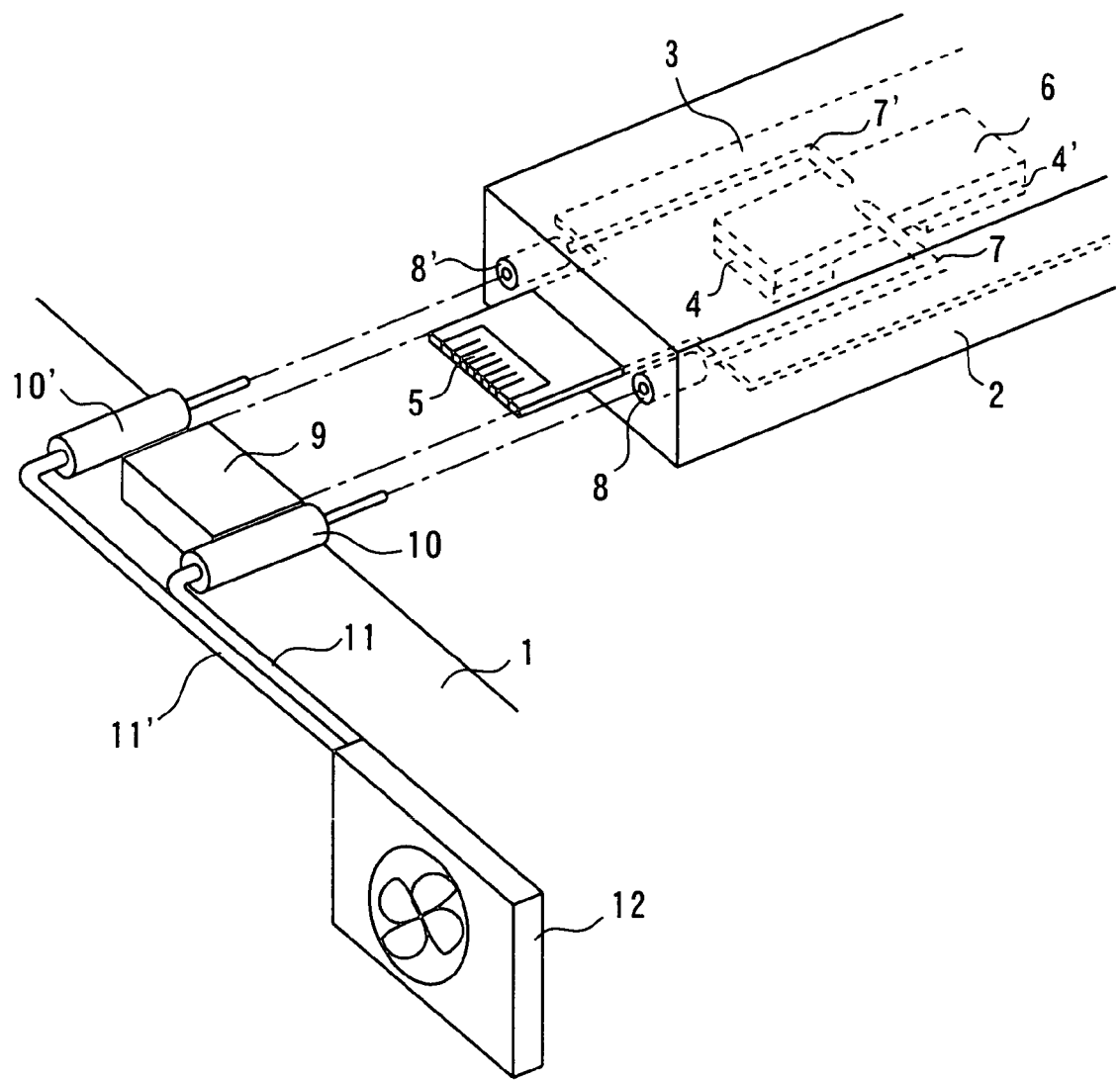
FIG. 1 is a perspective view of an electronic device according to a first embodiment of the present invention.

FIG. 1 is a perspective view of an electronic device according to a first embodiment of the present invention. This electronic device includes a host device 1 and an optical transceiver 2 which is a peripheral device detachably connected to the host device 1. Such a configuration allows the optical transceiver 2 to be replaced as necessary, for example, when it malfunctions or when it need be replaced by a more sophisticated optical transceiver.

A substrate 3 is provided within the enclosure of the optical transceiver 2. The substrate 3 has thereon components constituting the optical transceiver. Specifically, electronic components 4 and 4' that generate heat are provided on the substrate 3. The electronic component 4 is, for example, a PHY-LSI or CDR-LSI for data communications, while the electronic component 4' is, for example, a laser emitting device or a photoreceptor device. An optical transceiver side electrical connector (or peripheral device side electrical connector) 5 is electrically connected to the electronic components 4 and 4' to electrically connect these electronic components to the host device 1. Further, a single heat sink 6 is tightly joined with both the electronic components 4 and 4'. One end of each heat pipe 7 and 7' (i.e., heat transfer means) is thermally connected to the electronic components 4 and 4' through the heat sink 6. Optical transceiver side heat transfer connectors 8 and 8' are thermally connected to the other ends of the heat pipes 7 and 7', respectively. This enables these ends to be thermally connected to the host device 1, thereby allowing the heat pipes 7 and 7' to transfer heat to the host device 1. These optical transceiver side heat transfer connectors 8 and 8' are formed of a conductive material having good thermal conductance, such as copper or aluminum.

Further, the host device 1 has a host device side electrical connector 9, which is detachably connected to the optical transceiver side electrical connector 5, and host device side heat transfer connectors 10 and 10', which are detachably connected to the optical transceiver side heat transfer connectors 8 and 8', respectively. One end of each heat pipe 11 and 11' (host device side heat transfer means) is connected to the host device side heat transfer connectors 10 and 10', respectively. The host device side heat transfer connectors 10 and 10' are formed of a conductive material having good thermal conductance, such as copper and aluminum. An external heat discharge means 12 (a cooling fan, etc.) is thermally connected to the other ends of the heat pipes 11 and 11'.

Figure 2:
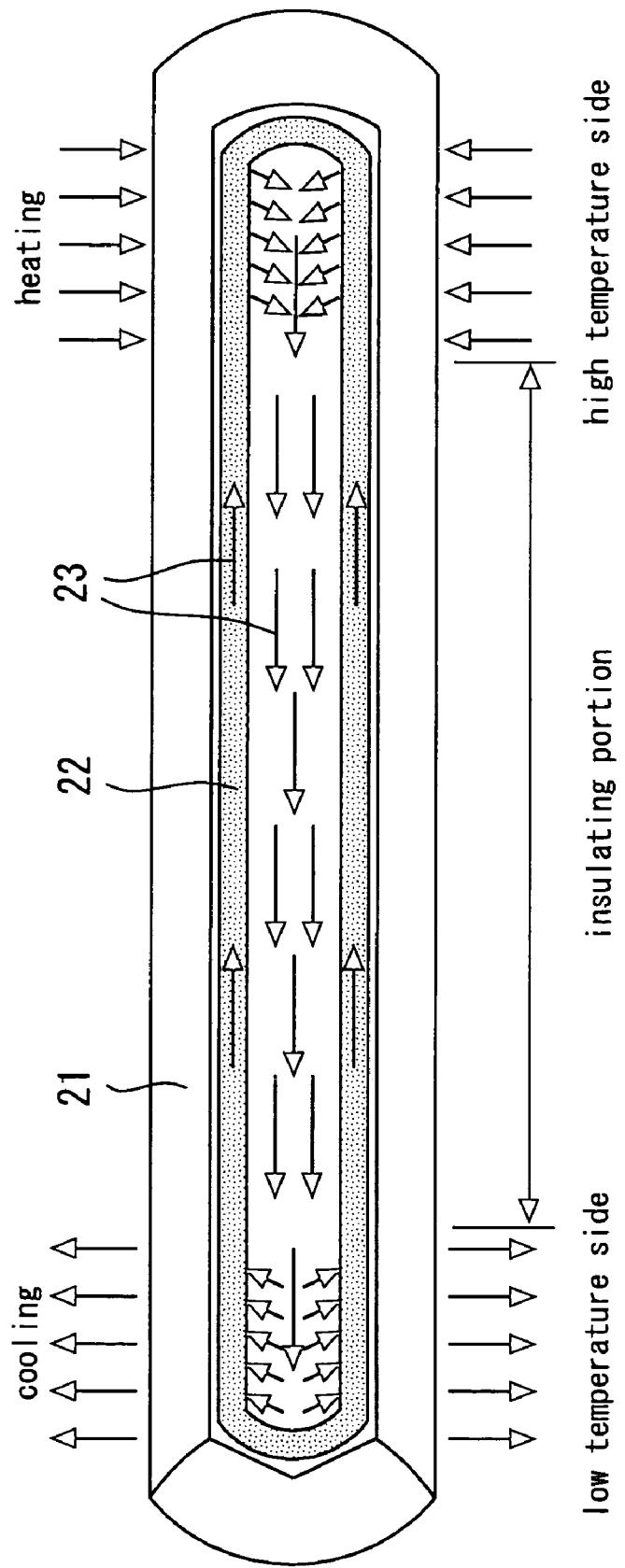
FIG. 2 shows a heat pipe.

The heat pipe 7 will now be described with reference to FIG. 2. The heat pipe 7 includes: a metal tube 21; a wick 22 formed of wire mesh or fabric and attached to the inside of the metal tube 21; and a refrigerant 23. The refrigerant 23 evaporates on the high temperature side connected to the heat sink 6, thereby absorbing a heat of vaporization. The evaporated refrigerant 23 then flow to the low temperature side connected to the optical transceiver side heat transfer connector 8, where the refrigerant 23 condenses again, releasing heat. The condensed refrigerant 23 returns from the low temperature side to the high temperature side due to the capillary action of the wick 22. This cycle is repeated to continuously transfer heat from the high temperature side to the low temperature side. Thus, the heat pipe 7 allows heat to be transferred to a remote location at high speed. It should be noted that the heat pipes 7', 11, and 11' work in the same manner as the heat pipe 7.

However, if the heat pipes 7 and 7' on the optical transceiver 2 side and the heat pipes 11 and 11' on the host device 1 side employ the same refrigerant, the heat pipes 11 and 11' on the host device 1 side cannot transfer heat. The reason for this is that the temperature of the host device side heat transfer connectors 10 and 10' (which constitute the high temperature side of the heat pipes 11 and 11' on the host device 1 side) becomes equal to the temperature at which the refrigerants within the heat pipes 7 and 7' on the optical transceiver 2 side recondense. As a result, since the refrigerants within the heat pipes 11 and 11' on the host device 1 side are not vaporized, these heat pipes 11 and 11' cannot efficiently transfer heat.

To prevent this from occurring, the refrigerants in the heat pipes 11, 11', 7, and 7' are selected such that the refrigerants in the heat pipes 11 and 11' have a vaporization temperature lower than the recondensation temperature of the refrigerants in the heat pipes 7 and 7'. For example, the refrigerants of the heat pipes 11 and 11' are selected to be ether, and those of the heat pipes 7 and 7' are selected to water. This allows the heat to be efficiently transferred.

The operation of the above electronic device will now be described. Upon power-on, the optical transceiver 2 attached to the host device 1 begins to operate after performing a predetermined initialization operation. At that time, power is supplied and various signals are input and output through the optical transceiver side electrical connector 5 provided at one end of the substrate 3 that has thereon various components of the optical transceiver. It should be noted that attaching the optical transceiver 2 to the host device 1 tightly joins the optical transceiver side heat transfer connectors 8 and 8' to the host device side heat transfer connectors 10 and 10', respectively. This reduces the heat transfer loss (from the host device 1 side to the peripheral device 2 side).

When the optical transceiver 2 begins to operate, the components mounted on the substrate 3 begins to generate heat. (Especially, the electronic components 4 and 4' generate intense heat.) The heat generated by the electronic components 4 and 4' is transferred to the external heat discharge means 12 through two paths made up of the heat sink 6, the heat pipes 7 and 7', the optical transceiver side heat transfer connectors 8 and 8', the host device side heat transfer connectors 10 and 10', and the heat pipes 11 and 11', respectively. The heat thus transferred is discharged from the host device 1 by the external heat discharge means 12. Thus, the optical transceiver 2 discharges (or transfers) the heat generated by the electronic components 4 and 4' to the host device 1 side through the heat pipes 7 and 7' and the optical transceiver side heat transfer connectors 8 and 8'.

Therefore, unlike conventional electronic devices, the electronic device of the present invention does not require any of air-cooling fins, a process of tightly attaching (the components) to a heat sink within the enclosure, and a blower mechanism provided within the host device to cool the optical transceiver, resulting in a reduced device size. Thus, the peripheral device (or transceiver device) of the present invention has a reduced size and is adapted to be detachably connected to the host device and to allow its electronic components to be efficiently cooled, thereby achieving stable communication operation.

It should be noted that although the above example has two heat transfer paths, more than two heat transfer paths may be employed, with the same effect.

Further, although in the example shown in FIG. 1 the heat generated by the optical transceiver 2 is transferred to the host device 1 by use of the heat pipes 7 and 7' and the optical transceiver side heat transfer connectors 8 and 8', the present embodiment is not limited to this particular arrangement. The end faces of the heat pipes 7 and 7' on the low temperature side may be adapted to perform the function of the optical transceiver side heat transfer connectors 8 and 8' (male type). In this case, eliminating the optical transceiver side heat transfer connectors 8 and 8' leads to increased thermal conductance as well as a low-cost device configuration.

Further, although in the example shown in FIG. 1 the optical transceiver side heat transfer connectors 8 and 8' are female connectors and the host device side heat transfer connectors 10 and 10' are male connectors, the present embodiment is not limited to this particular arrangement. The optical transceiver side heat transfer connectors 8 and 8' may be male connectors and the host device side heat transfer connectors 10 and 10' may be female connectors. Further, the optical transceiver side heat transfer connectors 8 and 8' may be thermally isolated from the enclosure of the optical transceiver 2 by providing a gap or rubber between them, in order to prevent the enclosure of the optical transceiver 2 from being heated.

Further, although in the present embodiment the peripheral device is an optical transceiver, the present invention can be applied to other peripheral devices employing a heat generating component, such as wireless transceivers and graphics cards.

Further, according to the present embodiment, the optical transceiver side heat transfer connectors may be connected to ground potential, specifically, frame ground potential. This protects the optical transceiver from disturbances, such as surges, that tend to occur when the optical transceiver is attached to the host device.

Second Embodiment

Figure 3:
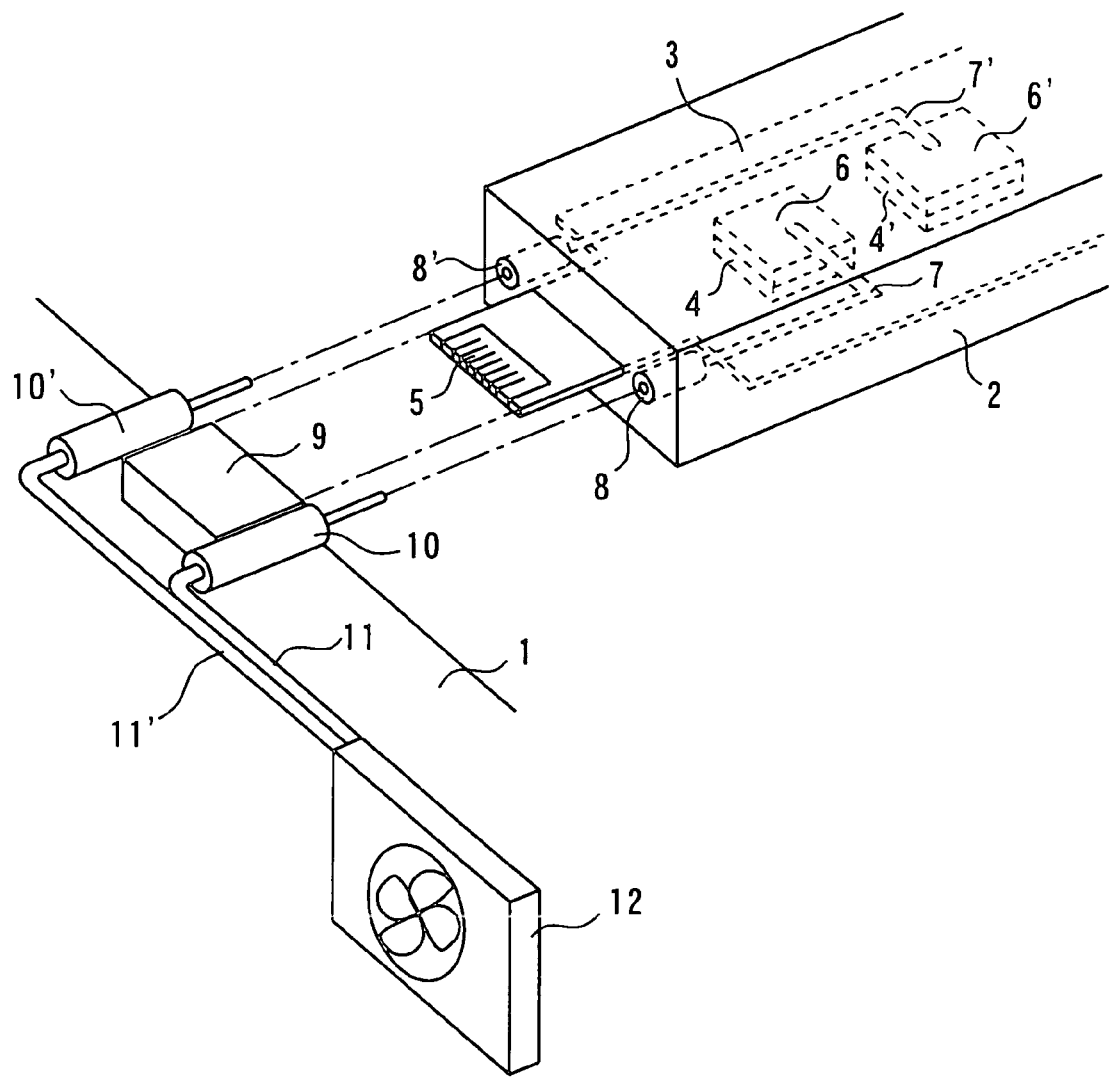
FIG. 3 is a perspective view of an electronic device according to a second embodiment of the present invention.

FIG. 3 is a perspective view of an electronic device according to a second embodiment of the present invention. It should be noted that in FIG. 3, components common to FIG. 1 are designated by the same reference numerals, and a description of these components will be omitted. According to the present embodiment, the electronic components 4 and 4' are joined to heat sinks 6 and 6', respectively, forming two separate heat transfer paths through which heat is discharged. This arrangement allows for efficient cooling of the electronic components 4 and 4' that generate different amounts of heat.

Third Embodiment

Figure 4:
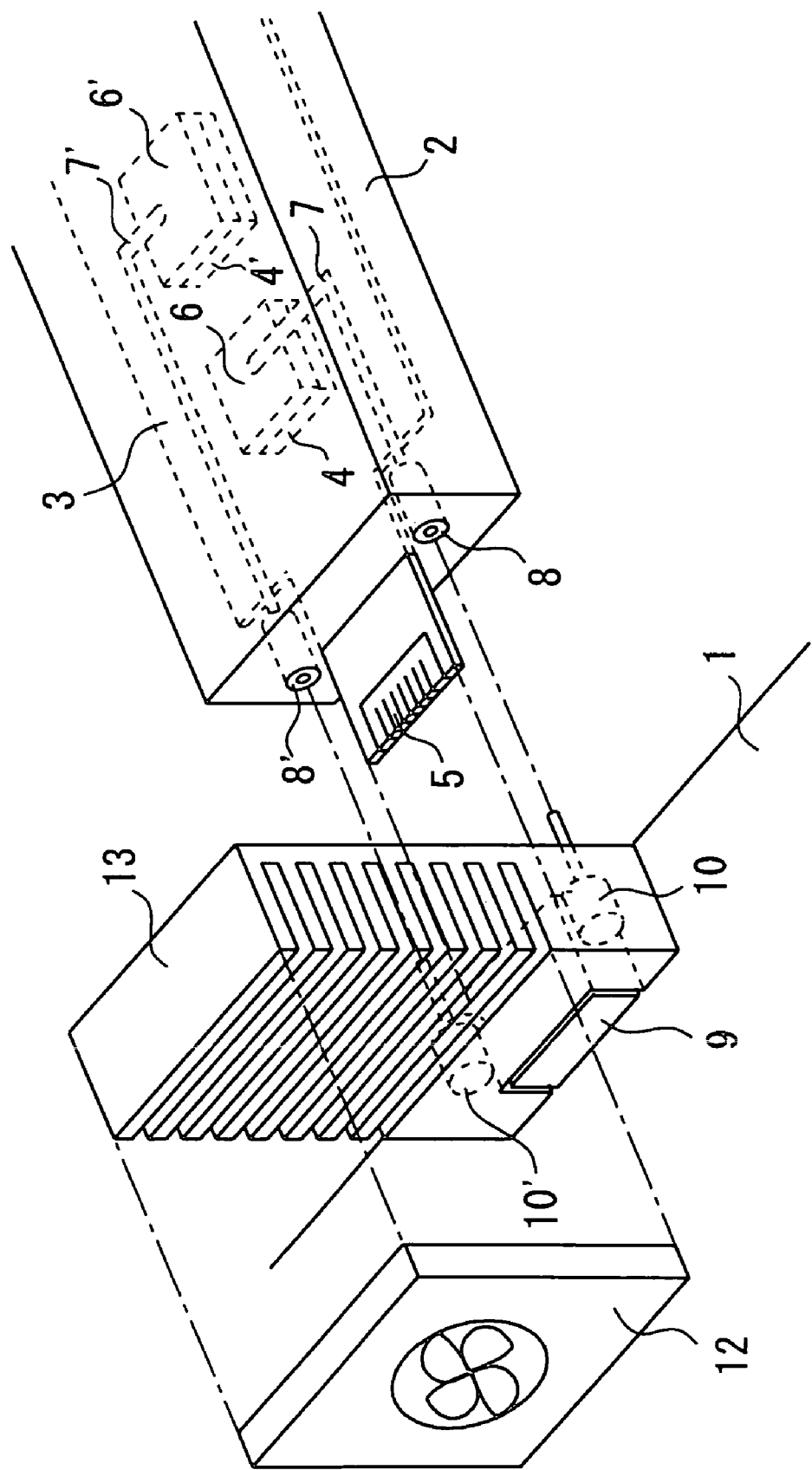
FIG. 4 is a perspective view of an electronic device according to a third embodiment of the present invention.
Figure 5:
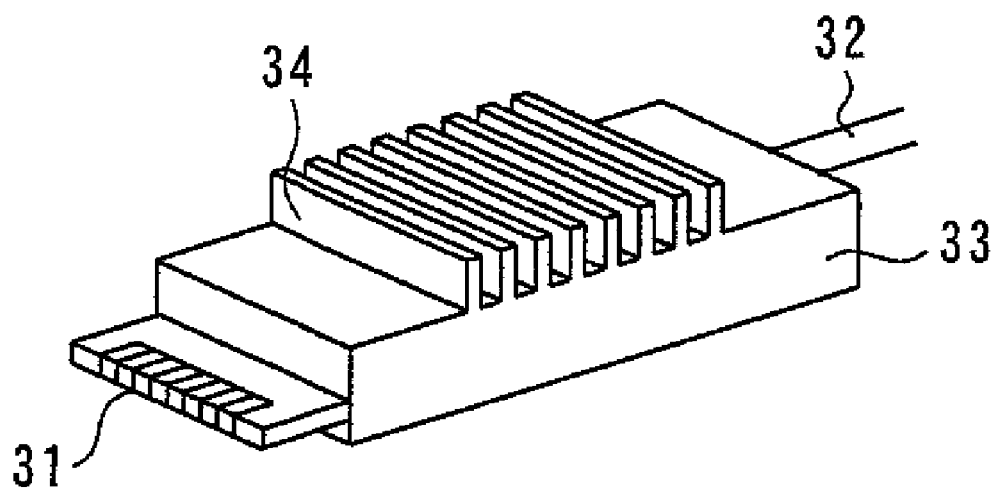
FIG. 5 is a perspective view of a typical conventional optical transceiver.

FIG. 4 is a perspective view of an electronic device according to a third embodiment of the present invention. It should be noted that in FIG. 4, components common to FIG. 1 are designated by the same reference numerals, and a description of these components will be omitted. According to the present embodiment, the external heat discharge means 12, such as a cooling fan, and a heat sink 13 are directly connected to the host device side heat transfer connectors 10 and 10'. This arrangement enables the host device side heat pipes 11 and 11' to be eliminated, resulting in reduced manufacturing cost.

Fourth Embodiment

According to a fourth embodiment of the present invention, an electronic device includes a host device that includes a heat source instead of external heat discharge means. With this arrangement, the heat generated by the heat source in the host device is supplied to electronic components (of the optical transceiver) through host device side heat transfer means, host device side heat transfer connectors, optical transceiver side heat transfer connectors, and optical transceiver side heat transfer means. Thus, the heat pipes, the heat transfer connectors, and the heat sink or sinks described in connection with the above embodiments can be used as warming means during cold start-up.

Further, the configuration of the electronic device of the present embodiment allows its optical transceiver to be efficiently tested and adjusted. Specifically, since the optical modules (a transmission laser diode and a reception photodetector) incorporated in the optical transceiver are susceptible to temperature variations, the modulation current must be adjusted according to their temperature. That is, to provide an optical transceiver operable over a wide temperature range, it is necessary to obtain the transmission/reception characteristics of the optical modules at high, normal, and low temperatures. Conventionally, an assembled optical transceiver is put in a temperature-controlled chamber, etc., and then various data is obtained to determine each control amount. However, this requires the enclosure of the optical transceiver to be heated or cooled. It takes time to increase or decrease the temperature of the enclosure to a set value, resulting in degradation in productivity. On the other hand, the electronic device of the present embodiment allows one to efficiently control the temperature (of the electronic components) of its optical transceiver to test and adjust it.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-276348, filed on Sep. 22, 2005 including specification, claims, drawings and summary, on which the Convention priority of the present application is based, are incorporated herein by reference in its entirety.

What is claimed is:

1. An electronic device comprising a host device and a peripheral device detachably connected to the host device, the peripheral device including:
   an electronic component that generates heat;
   a peripheral device side electrical connector electrically connected to the electronic component;
   a peripheral device side heat pipe having a first end thermally connected to the electronic component; and
   a peripheral device side heat transfer connector thermally connected to a second end of the peripheral device side heat pipe;
the host device including:
   a host device side electrical connector detachably connected to the peripheral device side electrical connector;
   a host device side heat transfer connector detachably connected to the peripheral device side heat transfer connector;
   a host device side heat pipe having a first end thermally connected to the host device side heat transfer connector; and
   external heat discharge means thermally connected to a second end of the host device side heat pipe, wherein
      heat generated by the electronic component is transferred to the external heat discharge means through the peripheral device side heat pipe, the peripheral device side heat transfer connector, the host device side heat transfer connector, and the host device side heat pipe,
      the external heat discharge means discharges the heat from the electronic device, and
      the host device side heat pipe contains a first refrigerant and the peripheral device side heat pipe contain a second refrigerant, and the fast refrigerant has a vaporization temperature lower than the recondensation temperature of the second refrigerant.

2. The electronic device as claimed in claim 1, wherein the peripheral device side heat transfer connector is connected to ground potential.

3. The electronic device as claimed in claim 1, wherein the peripheral device is a transceiver for communications.

4. The electronic device as claimed in claim 1, wherein the first refrigerant is ether and the second refrigerant is water.

5. An electronic device comprising a host device and a peripheral device detachably connected to the host device, the peripheral device including:
   an electronic component;
   a peripheral device side electrical connector electrically connected to the electronic element;
   a peripheral device side heat pipe having a first end thermally connected to the electronic component; and
   a peripheral device side heat transfer connector thermally connected to a second end of the peripheral device side heat pipe;
the host device including:
   a host device side electrical connector detachably connected to the peripheral device side electrical connector;
   a host device side heat transfer connector detachably connected to the peripheral device side heat transfer connector;

a host device side heat pipe having a first end thermally connected to the host device side heat transfer connector; and a heat source thermally connected to a second end of the host device side heat pipe, wherein heat generated by the heat source is supplied to the electronic component through the host device side heat pipe, the host device side heat pipe contains a first refrigerant, the peripheral device side heat pipe contains a second refrigerant, and the second refrigerant has a vaporization temperature lower than the recondensation temperature of the first refrigerant.

6. The electronic device as claimed in claim 5, wherein the peripheral device side heat transfer connector is connected to ground potential.

7. The electronic device as claimed in claim 5, wherein the peripheral device is a transceiver for communications.

8. The electronic device as claimed in claim 5, wherein the first refrigerant is ether and the second refrigerant is water.

* * * * *